United States Patent
Chang et al.

(10) Patent No.: US 9,620,211 B1
(45) Date of Patent: Apr. 11, 2017

(54) MAINTAINING DEVICE, MAINTENANCE METHOD, COMPUTER PROGRAM PRODUCT, AND COMPUTER READABLE MEDIUM

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Yu-Ting Su, Kaohsiung (TW); Chih-Hung Pan, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 15/203,443

(22) Filed: Jul. 6, 2016

(30) Foreign Application Priority Data

Apr. 27, 2016 (TW) .............................. 105113174 A

(51) Int. Cl.
*G11C 11/00* (2006.01)
*G11C 13/00* (2006.01)
*H01L 45/00* (2006.01)

(52) U.S. Cl.
CPC .......... *G11C 13/0097* (2013.01); *H01L 45/08* (2013.01)

(58) Field of Classification Search
USPC ................................... 365/148, 174, 189.011
See application file for complete search history.

(56) References Cited

U.S. PATENT DOCUMENTS

| | | | |
|---|---|---|---|
| 8,981,327 B1* | 3/2015 | Mathur | H01L 45/00 257/2 |
| 9,246,092 B1* | 1/2016 | Bodke | H01L 45/00 |

* cited by examiner

Primary Examiner — Vu Le
(74) Attorney, Agent, or Firm — Alan D. Kamrath; Kamrath IP Lawfirm, P.A.

(57) ABSTRACT

A maintaining device and a maintenance method for maintaining the normal operation of a resistive random access memory are disclosed. The maintenance method can be executed by the maintaining device. Said memory includes first and second electrodes. The first electrode is not grounded. The maintaining device is connected to the first electrode so that the first electrode receives an operational signal and a restoring signal generated by the maintaining device. The operational signal transits from a zero voltage to a non-zero voltage and then to the zero voltage. If the operational signal has already transited from the non-zero voltage to the zero voltage, the maintenance method controls the restoring signal to transit from the zero voltage to a negative voltage, controls the restoring signal to remain the negative voltage for a period of restoring time, and controls the restoring signal to transit from the negative voltage to the zero voltage.

18 Claims, 6 Drawing Sheets

US 9,620,211 B1

MAINTAINING DEVICE, MAINTENANCE METHOD, COMPUTER PROGRAM PRODUCT, AND COMPUTER READABLE MEDIUM

CROSS REFERENCE TO RELATED APPLICATIONS

The application claims the benefit of Taiwan application serial No. 105113174, filed on Apr. 27, 2016, and the subject matter of which is incorporated herein by reference.

BACKGROUND OF THE INVENTION

1. Field of the Invention

The present disclosure generally relates to a maintaining device, a maintenance method, a computer program product, and a computer readable medium of a resistive random access memory and, more particularly, to a maintaining device, a maintenance method, a computer program product, and a computer readable medium for maintaining the normal operation of a resistive random access memory.

2. Description of the Related Art

Resistive random access memories (RRAMs) have an extremely low operating voltage, an extremely high read/write speed, and high miniaturization of the element size, and are in M/I/M or M/I/M/I/M (complementary) structure. Thus, resistive random access memories may replace the conventional flash memories and dynamic random access memories (DRAMs) as the main stream of memory elements of the next generation.

FIG. 1 shows a conventional resistive random access memory 9, which includes two electrodes 91 and a resistance changing layer 92 sandwiched between the two electrodes 91. The resistance changing layer 92 may be formed from a single or multiple materials. One electrode 91 may be grounded while the other one may be electrically connected to a voltage source V to receive different voltages (as shown in FIG. 2). Under the voltage supply of the voltage source V, the resistive random access memory 9 may perform at least one operational step, such as a setting step P1 and a resetting step P2. Accordingly, the resistive random access memory 9 may have a redox reaction and therefore can switch between the low resistance state (LRS) and the high resistance state (HRS). The two resistance states can be used to store two logic states of the data (such as 0 and 1).

Referring to FIG. 3, as the conventional resistive random access memory operates more and more frequently, the oxygen ions of the resistance changing layer 92 will gradually disperse. As a disadvantage, the resistance values of the LRS and HRS will become more and more close. Specifically, after the resistive random access memory operates for a large number of times (such as $1\times10^8$ times), the resistive random access memory can no longer function normally due to the small difference between the resistances of the LRS and HRS. Thus, the conventional resistive random access memory does not have a long service life and high reliability, leading to a higher cost of data storage.

In light of this, it is necessary to improve the conventional resistive random access memory.

SUMMARY OF THE INVENTION

It is therefore the objective of this disclosure to provide a maintaining device capable of maintaining the normal operation of a resistive random access memory. Through the use of the maintaining device, the durability of the resistive random access memory can be improved.

It is another objective of this disclosure to provide a maintenance method of a resistive random access memory. Through the performance of the maintenance method, the durability of the resistive random access memory can be improved.

It is a further objective of this disclosure to provide a computer program product having a computer program. The computer program can be loaded in and executed by a computer having the maintaining device. Through the execution of the computer program, the durability of the resistive random access memory can be improved.

It is still a further objective of this disclosure to provide a computer readable medium storing a computer program. The computer program can be loaded in and executed by a computer having the maintaining device. Through the execution of the computer program, the durability of the resistive random access memory can be improved.

In an embodiment of the disclosure, a maintaining device capable of maintaining the normal operation of a resistive random access memory is disclosed. The resistive random access memory includes a first electrode and a second electrode. The first electrode is not grounded. The maintaining device is adapted to output an operational signal and a restoring signal to the first electrode of the resistive random access memory. The maintaining device includes a signal generation module and a calculation module coupled with the signal generation module. The calculation module controls the signal generation module to generate the operational signal based on a command, and controls the operational signal to transit from a zero voltage to a non-zero voltage and then back to the zero voltage during a period of operational time. The calculation module determines whether the operational signal has already transited from the non-zero voltage back to the zero voltage. If the determined result is positive, the calculation module controls the signal generation module to generate the restoring signal based on a restoring command, controls the restoring signal to transit from the zero voltage to a negative voltage, controls the restoring signal to remain the negative voltage for a period of restoring time, and then controls the restoring signal to transit from the negative voltage back to the zero voltage. If the determined result is negative, the calculation module keeps monitoring a voltage level of the operational signal.

In another embodiment of the disclosure, a maintenance method of a resistive random access memory is disclosed. The maintenance method is performed by a maintaining device to maintain the normal operation of the resistive random access memory. The resistive random access memory includes a first electrode and a second electrode. The first electrode is not grounded. The maintaining device is electrically connected to the first electrode of the resistive random access memory so that the first electrode receives an operational signal and a restoring signal generated by the maintaining device. The operational signal transits from a zero voltage to a non-zero voltage and then back to the zero voltage during a period of operational time. If the operational signal has already transited from the non-zero voltage back to the zero voltage, the maintenance method includes controlling the restoring signal to transit from the zero voltage to a negative voltage, controlling the restoring signal to remain the negative voltage for a period of restoring time, and controlling the restoring signal to transit from the negative voltage to the zero voltage.

In a further embodiment of the disclosure, a computer program product having a computer program is disclosed.

The computer program can be loaded in and executed by a computer to execute the maintenance method of the resistive random access memory.

In a still further embodiment of the disclosure, a computer readable medium storing a computer program is disclosed. The computer program can be loaded in and executed by a computer to execute the maintenance method of the resistive random access memory.

In a form shown, the maintaining device can generate a positive potential during the period of restoring time. The positive potential is adapted to be outputted to the second electrode of the resistive random access memory. The period of restoring time may be larger than 1 ns. The non-zero voltage is a positive or negative voltage. The restoring signal may be a square wave or a trapezoidal wave. The calculation module calculates a total number of times the operational signal has been outputted, and generates the restoring command when the total number of times of the operational signal has reached a predetermined value. In this manner, the dispersion of the oxygen ions of the resistance changing layer can be prevented or reduced. Therefore, sufficient amount of the oxygen ions can remain in the resistance changing layer for oxidation reaction of the filament of the resistance changing layer, and the resistance states of the resistive random access memory can remain highly distinguishable.

In the maintaining device, the maintenance method, the computer program product, and the computer readable medium, the restoring signal can be generated after the resistive random access memory operates in any number of times. The restoring signal can supply an electric field to the resistance changing layer of the resistive random access memory to suppress the dispersion of the oxygen ions of the resistance changing layer. As such, sufficient amount of the oxygen ions can be retained in the resistance changing layer for oxidation reaction of the filament of the resistance changing layer. Therefore, the high resistance state and low resistance state of the resistive random access memory can remain highly distinguishable, avoiding errors in reading the data resulting from the small difference between the resistance values of the HRS and LRS. Advantageously, the reliability is improved, the service life is prolonged, and data errors are avoided.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein.

Figure 1:
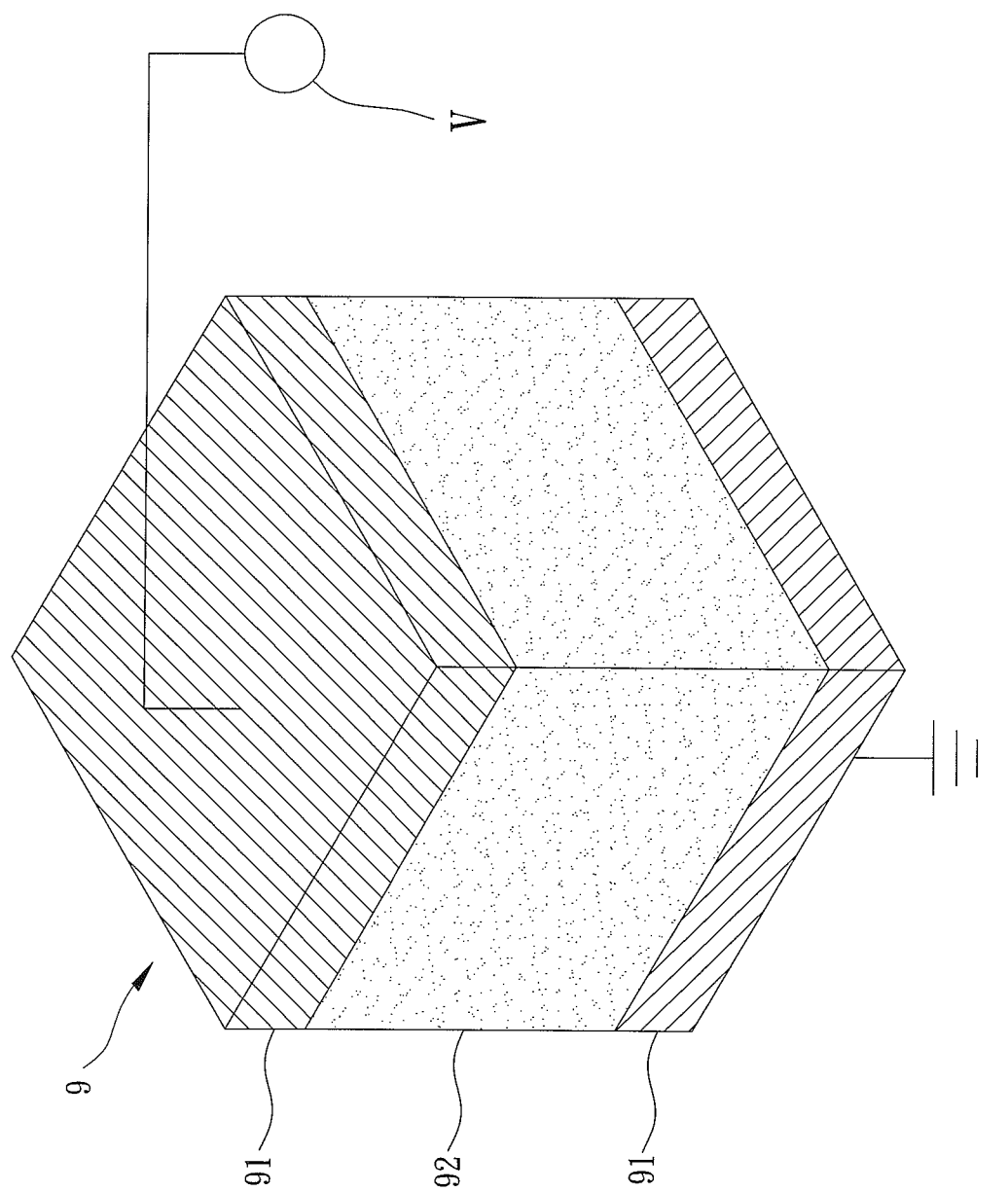
FIG. 1 shows a use of a conventional resistive random access memory.
Figure 2:
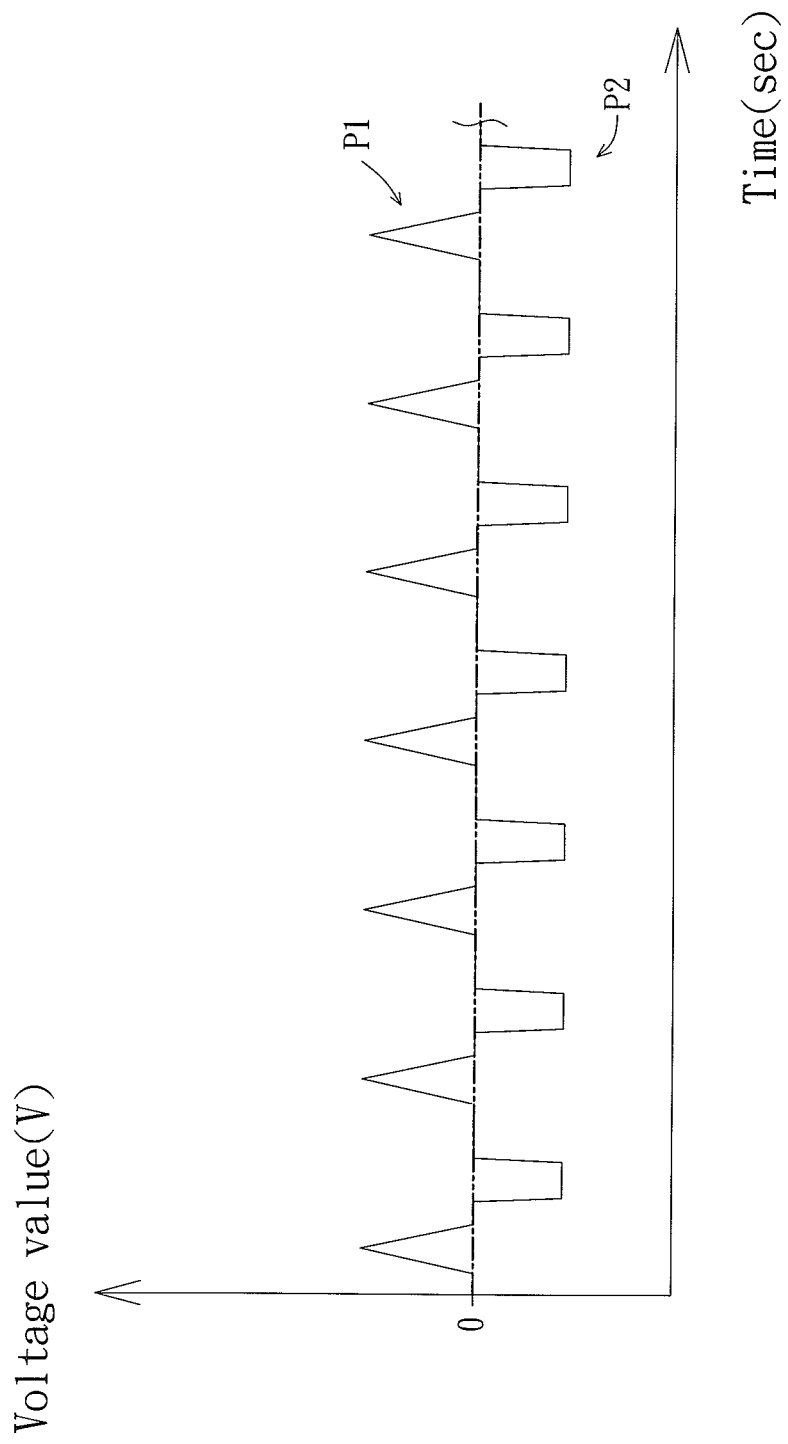
FIG. 2 shows a waveform of a voltage source of the conventional resistive random access memory.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

Figure 4:
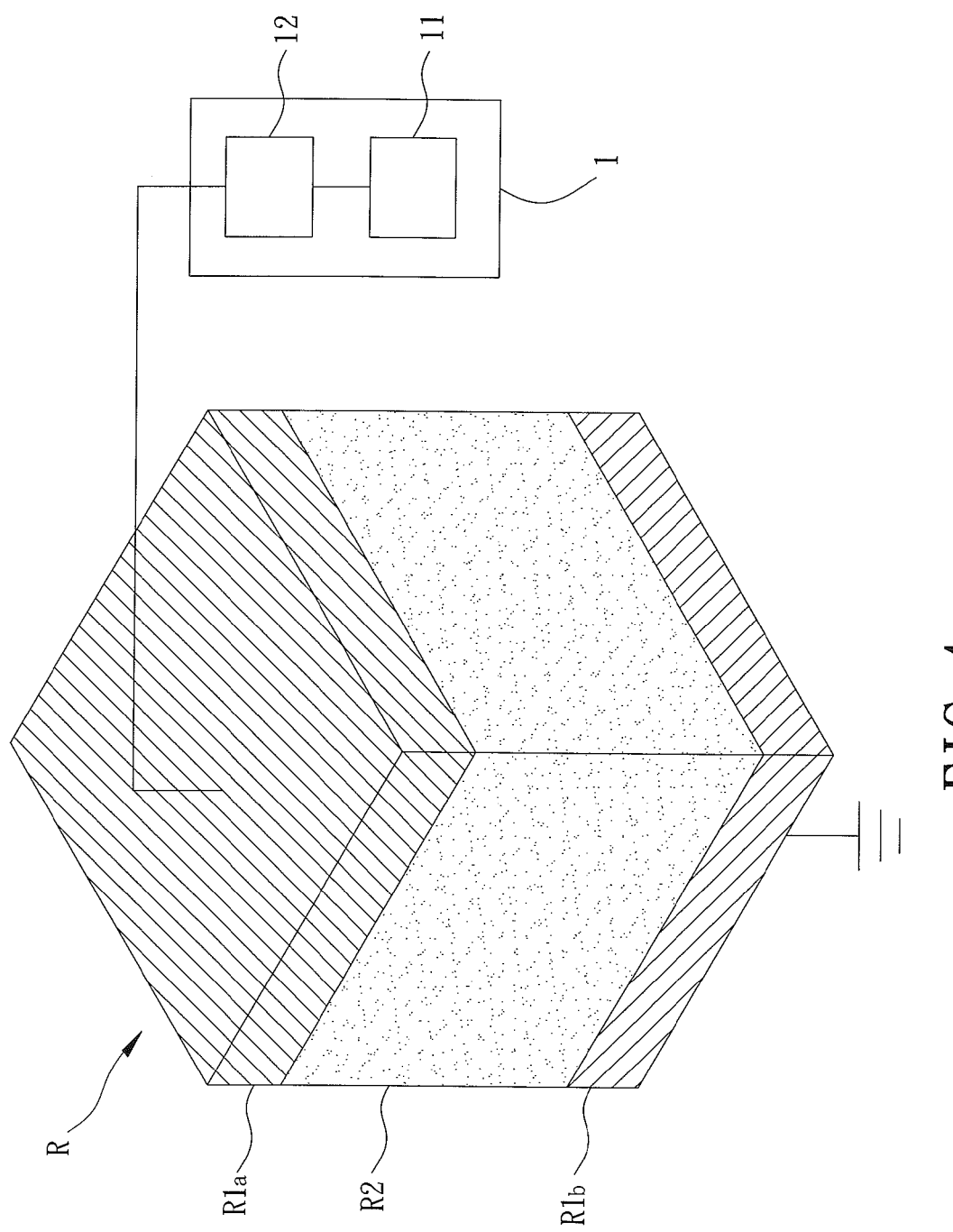
FIG. 4 shows a use of a maintaining device in maintaining the normal operation of a resistive random access memory according to a first embodiment of the disclosure.
Figure 5:
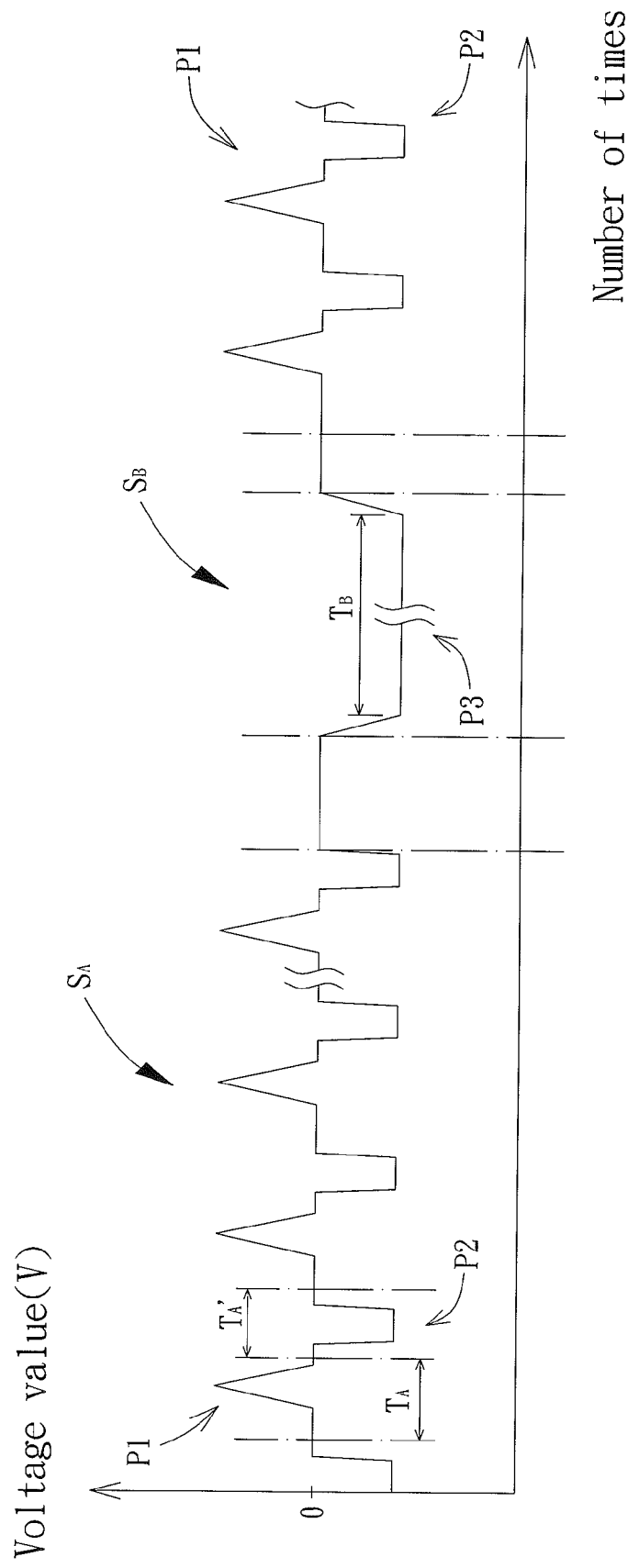
FIG. 5 shows a waveform of an operational signal and a restoring signal as generated by the maintaining device of the disclosure.

FIG. 4 shows a use of a maintaining device 1 in maintaining the normal operation of a resistive random access memory R according to an embodiment of the disclosure. The maintaining device 1 may generate at least one operational signal $S_A$ and a restoring signal $S_B$ (as shown in FIG. 5). The resistive random access memory R includes two electrodes R1a and R1b, in which the electrode R1b is grounded while the electrode R1a is not.

The operational signal $S_A$ and the restoring signal $S_B$ may be supplied to the electrode R1a of the resistive random access memory R. During a period of operational time $T_A$ or $T_A{'}$, the maintaining device 1 can control the operational signal $S_A$ to transit from the zero voltage to a non-zero voltage (which is a negative or positive voltage) and then back to the zero voltage. When the operational signal $S_A$ transits from the non-zero voltage to the zero voltage, the maintaining device 1 can control the restoring signal $S_B$ to transit from the zero voltage to a negative voltage. The restoring signal $S_B$ remains the negative voltage for a period of restoring time $T_B$ and then transits from the negative voltage back to the zero voltage. The principle is described in detail below, but it is not used to limit the disclosure.

As an example, as shown in FIG. 4, the resistive random access memory R may be any kind of resistive random access memory, such as those having M/I/M (as shown in FIG. 1) or M/I/M/I/M structures. The resistive random access memory R may include two electrodes R1a and R1b (made of electrically conductive material such as TiN or Ag) and a resistance changing layer R2 (made of a single or multiple layers of $SiO_2$ material). The resistance changing layer R2 is sandwiched between the two electrodes R1a and R1b. The electrode R1a may be electrically connected to the maintaining device 1, and the electrode R1b may be grounded. However, a switch may be used to connect the electrode R1b to a positive potential instead of ground.

As shown in FIGS. 4 and 5, the maintaining device 1 may be any device having a control function, such as a computer, an embedded system, a system on chip (SoC), an application-specific integrated circuit (ASIC), a power supply or a signal generator. The maintaining device 1 may execute a signal generating logic/program to generate the operational signal $S_A$ and the restoring signal $S_B$. In the embodiment, the maintaining device 1 may be a programmable power supply, but is not limited thereto. The resistive random access memory R may be operated by the operational signal $S_A$ to perform at least one operational step. The operational step includes the aforementioned setting step P1 where the operational signal $S_A$ transits from the zero voltage to a positive voltage and then back to the zero voltage. The operational step also includes the aforementioned resetting step P2 where the operational signal $S_A$ transits from the zero voltage to a negative voltage and then back to the zero voltage.

After the resistive random access memory R has operated more than a predetermined number of times, the maintaining device 1 may generate the restoring signal $S_B$. For example, when the operational signal $S_A$ transits from the positive/negative voltage to the zero voltage, the maintaining device 1 may control the restoring signal $S_B$ to transit from the zero voltage to a negative voltage. The restoring signal $S_B$ remains the negative voltage for the period of restoring time $T_B$ (larger than 1 ns, for example), and then transits from the negative voltage to the zero voltage. As such, the resistive random access memory R can perform a recovery process P3. In the following, the cooperation between the hardware and software of the resistive random access memory R is described.

For example, as shown in FIGS. 4 and 5, the maintaining device 1 may include a calculation module 11 and a signal generation module 12 coupled with the calculation module 11. Each of the calculation module 11 and the signal generation module 12 may be implemented as a hardware module or a software module for mutual cooperation. The calculation module 11 may control the signal generation module 12 to generate the operational signal $S_A$ based on a command (which is inputted by the user or generated by an electronic device). As such, during the period of operational time $T_A$ or $T_A'$, the operational signal $S_A$ transits from the zero voltage to a non-zero voltage and then back to the zero voltage. The calculation module 11 may determine whether the operational signal $S_A$ has already transited from the non-zero voltage to the zero voltage. If so, the calculation module 11 may control the signal generation module 12 to generate the restoring signal $S_B$ based on a restoring command, controls the restoring signal $S_B$ to transit from the zero voltage to a negative voltage, controls the restoring signal $S_B$ to remain the negative voltage for the period of restoring time $T_B$, and then controls the restoring signal $S_B$ to transit from the negative voltage to the zero voltage. In another case, if the operational signal $S_A$ has not yet transited from the non-zero voltage to the zero voltage, the calculation module 11 may keep monitoring the voltage level of the operational signal $S_A$.

The calculation module 11 may also calculate the total number of times the operational signal $S_A$ has been outputted. In this regard, the calculation module 11 can generate the restoring command when the total number of times of the operational signal $S_A$ has reached a predetermined value (such as $1 \times 10^8$). Accordingly, the signal generation module 12 can generate the restoring signal $S_B$, controls the restoring signal $S_B$ to transit from the zero voltage to a negative voltage, controls the restoring signal $S_B$ to remain the negative voltage for the period of restoring time $T_B$, and then controls the restoring signal $S_B$ to transit from the negative voltage to the zero voltage. The restoring signal $S_B$ may have a square wave, a trapezoidal wave, a triangular wave or a polygonal wave with a negative voltage, such that the resistive random access memory R can have a better performance.

Figure 3:
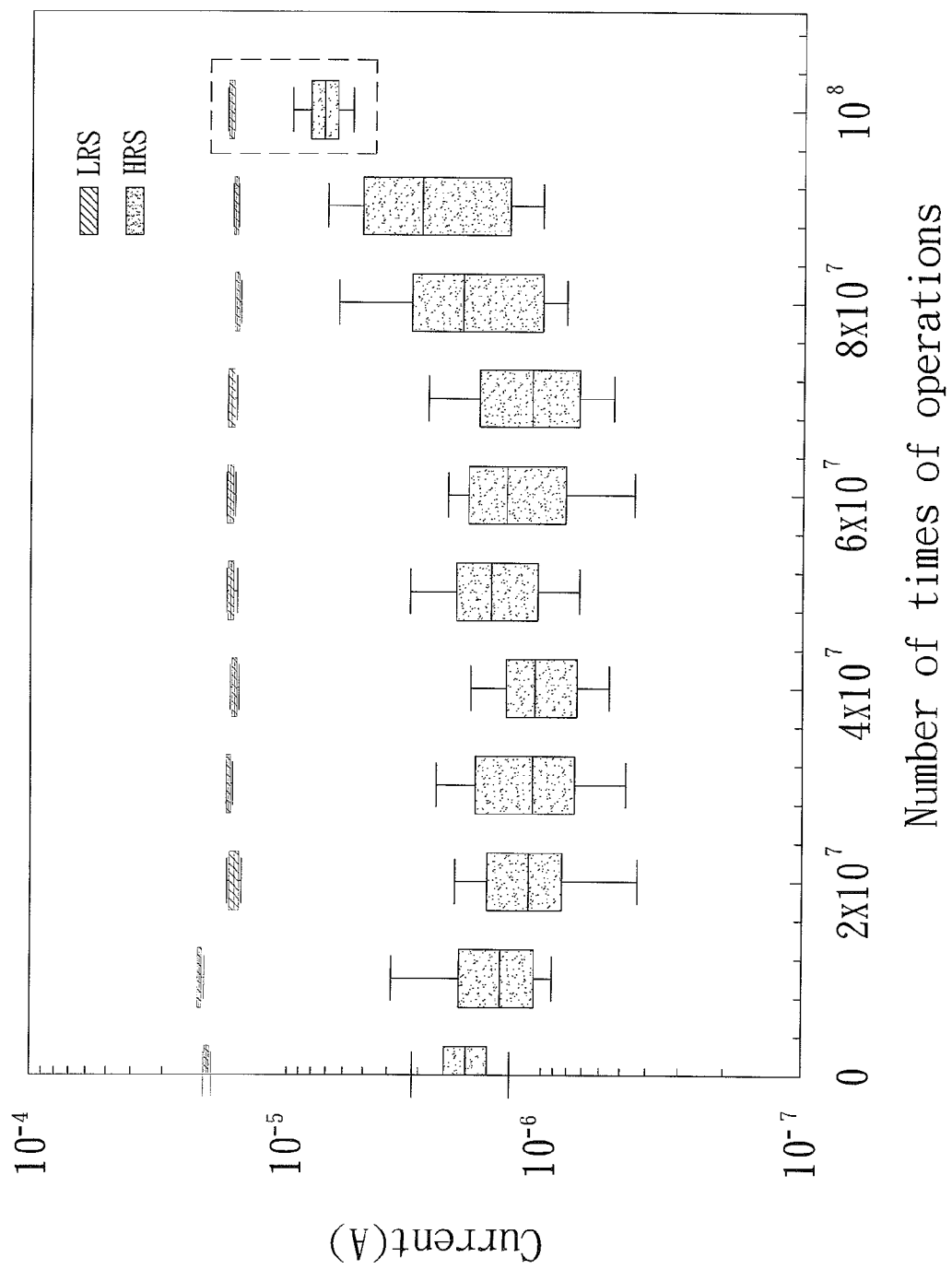
FIG. 3 shows a relation between the resistance state and the number of times of operations of the conventional resistive random access memory.
Figure 6:
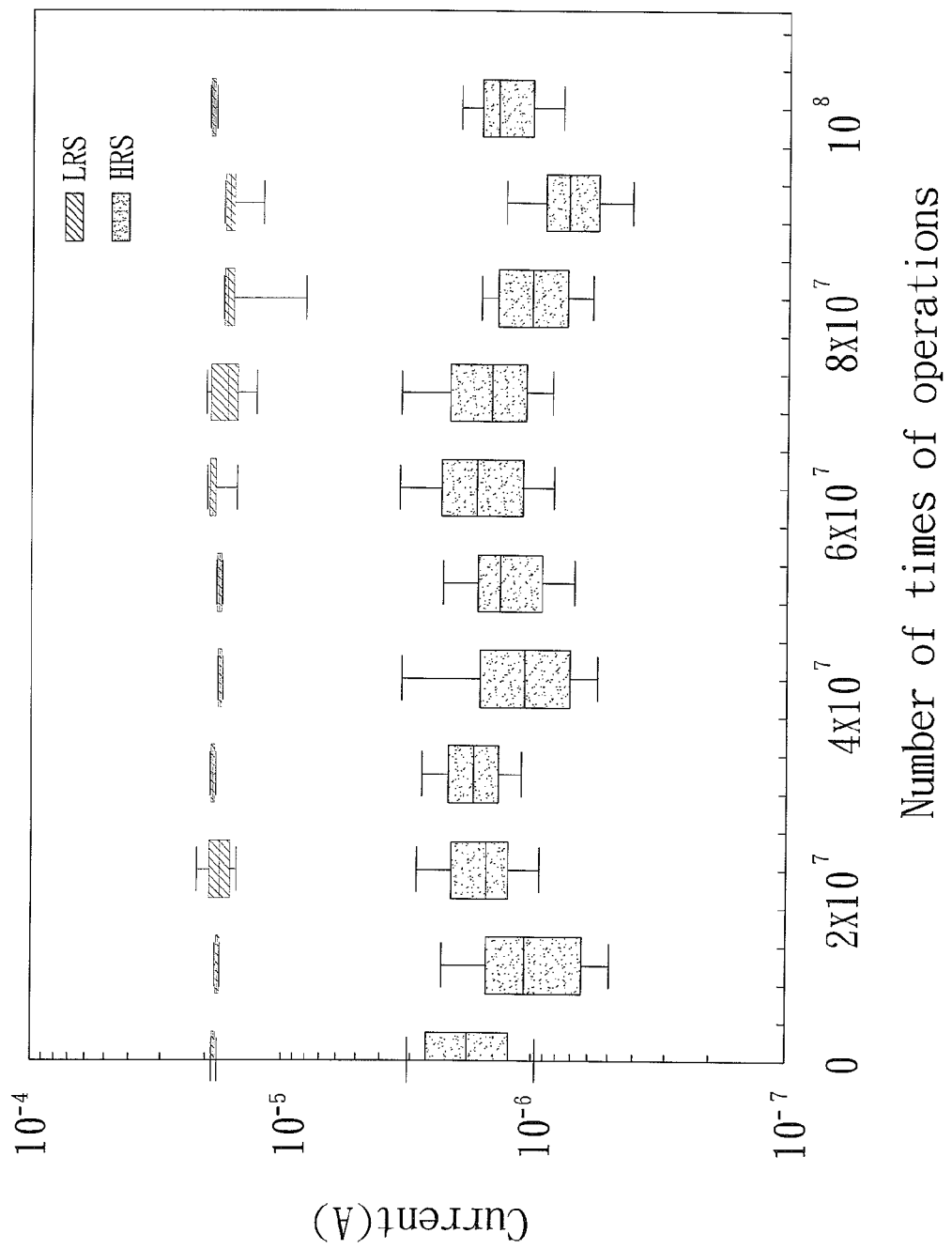
FIG. 6 shows a relation between the resistance state and the number of times of operations of the conventional resistive random access memory when the restoring signal of the disclosure is used in the conventional resistive random access memory.

It is noted that the electrode R1a as shown in FIG. 4 will be positively charged during the above processes. Thus, the electrode R1a will attract the oxygen ions that are negatively charged. The oxygen ions will gradually disperse towards the electrode R1a. To prevent the dispersion of the oxygen ions of the resistance changing layer R2, the electrode R1a may be supplied with a certain potential that can prevent the dispersion of the oxygen ions of the resistance changing layer R2. For example, the resistance changing layer R2 in FIG. 5 may be supplied with a negative voltage during the recovery process P3. As such, an electric field can be supplied to the resistance changing layer R2. Specifically, the electrode R1a can be negatively charged to provide a repulsive force for the oxygen ions, preventing the dispersion of the oxygen ions of the resistance changing layer R2. Based on this, the electrode R1b as originally grounded can be supplied with a positive potential to further improve the retaining effect of the oxygen ions. As such, sufficient amount of the oxygen ions can remain in the resistance changing layer R2 for oxidation reaction of the filament of the resistance changing layer R2. Therefore, after the resistive random access memory operates in a certain number of times, the HRS and LRS of said memory can remain highly distinguishable as shown in FIG. 6. Accordingly, the resistive random access memory of the disclosure can overcome the abnormal functioning of the conventional resistive random access memory resulting from a small difference between the high and low resistance states (as shown in FIG. 3).

Referring to FIGS. 4 and 5, the maintaining device 1 can be operated by a maintenance method of the resistive random access memory according to a second embodiment of the disclosure. The maintenance method is used to maintain the normal operation of the resistance states of the resistive random access memory. The maintaining device 1 can be electrically connected to the electrode R1a in order to receive the operational signal $S_A$ and the restoring signal $S_B$ generated by the maintaining device 1. During the period of operational time $T_A$, the operational signal $S_A$ can transit from the zero voltage to a non-zero voltage and then back to the zero voltage. The maintenance method may include generating the restoring signal $S_B$ by the maintaining device 1 when the operational signal $S_A$ transits from the non-zero voltage to the zero voltage. The restoring signal $S_B$ may transit from the zero voltage to a negative voltage and then back to the zero voltage during the restoring time $T_B$. The details regarding the restoring time, the non-zero voltage and the waveform of the restoring signal have been described before, and therefore are not discussed herein again.

Besides, the maintenance method of the resistive random access memory can be implemented into a computer program (such as the aforementioned signal generating program) using a programming language, such as C++ or Java. The programming can be readily appreciated by the skilled persons. Upon this, a computer program product can be generated. The computer program product can be stored in a computer readable medium such as any kind of memories, memory cards, hard drives, optical discs or $US_B$ discs. When the computer (the maintaining device 1 or an embedded system having a control function) loads and executes the computer program, the maintenance method of the second embodiment of the disclosure can be executed to perform the cooperation between the hardware (the maintaining device 1) and software.

Based on this, according to the maintaining device, the maintenance method and the computer readable medium of the embodiments of the disclosure, the restoring signal can be generated after the resistive random access memory operates in any number of times. The restoring signal can supply an electric field to the resistance changing layer of the resistive random access memory to suppress the dispersion of the oxygen ions of the resistance changing layer. As such, sufficient amount of the oxygen ions can be retained in the resistance changing layer R2 for oxidation reaction of the filament of the resistance changing layer. Therefore, the high resistance state and low resistance state of the resistive random access memory can remain highly distinguishable, avoiding errors in reading the data resulting from the small difference between the resistance values of the HRS and LRS. Advantageously, the reliability is improved, the service life is prolonged, and data errors are avoided.

Although the disclosure has been described in detail with reference to its presently preferable embodiments, it will be understood by one of ordinary skill in the art that various modifications can be made without departing from the spirit and the scope of the disclosure, as set forth in the appended claims.

What is claimed is:

1. A maintaining device for maintaining the normal operation of a resistive random access memory, wherein the resistive random access memory comprises a first electrode and a second electrode, wherein the first electrode is not grounded, wherein the maintaining device is adapted to output an operational signal and a restoring signal to the first electrode of the resistive random access memory, wherein the maintaining device comprises:
   a signal generation module;
   a calculation module coupled with the signal generation module, wherein the calculation module controls the signal generation module to generate the operational signal based on a command, and controls the operational signal to transit from a zero voltage to a non-zero voltage and then back to the zero voltage during a period of operational time, wherein the calculation module determines whether the operational signal has already transited from the non-zero voltage back to the zero voltage, wherein, if the determined result is positive, the calculation module controls the signal generation module to generate the restoring signal based on a restoring command, controls the restoring signal to transit from the zero voltage to a negative voltage, controls the restoring signal to remain the negative voltage for a period of restoring time, and then controls the restoring signal to transit from the negative voltage back to the zero voltage, wherein, if the determined result is negative, the calculation module keeps monitoring a voltage level of the operational signal.

2. The maintaining device for maintaining the normal operation of the resistive random access memory as claimed in claim 1, wherein a positive potential is generated during the period of restoring time, and wherein the positive potential is adapted to be outputted to the second electrode of the resistive random access memory.

3. The maintaining device for maintaining the normal operation of the resistive random access memory as claimed in claim 1, wherein the period of restoring time is larger than 1ns.

4. The maintaining device for maintaining the normal operation of the resistive random access memory as claimed in claim 1, wherein the non-zero voltage is a positive voltage.

5. The maintaining device for maintaining the normal operation of the resistive random access memory as claimed in claim 1, wherein the non-zero voltage is a negative voltage.

6. The maintaining device for maintaining the normal operation of the resistive random access memory as claimed in claim 1, wherein the restoring signal is a square wave.

7. The maintaining device for maintaining the normal operation of the resistive random access memory as claimed in claim 1, wherein the restoring signal is a trapezoidal wave.

8. The maintaining device for maintaining the normal operation of the resistive random access memory as claimed in claim 1, wherein the calculation module calculates a total number of times the operational signal has been outputted, and wherein the calculation module generates the restoring command when the total number of times of the operational signal has reached a predetermined value.

9. A maintenance method of a resistive random access memory, wherein the maintenance method is performed by a maintaining device to maintain the normal operation of the resistive random access memory, wherein the resistive random access memory comprises a first electrode and a second electrode, wherein the first electrode is not grounded, wherein the maintaining device is electrically connected to the first electrode of the resistive random access memory so that the first electrode receives an operational signal and a restoring signal generated by the maintaining device, wherein the operational signal transits from a zero voltage to a non-zero voltage and then back to the zero voltage during a period of operational time, wherein, if the operational signal has already transited from the non-zero voltage back to the zero voltage, the maintenance method comprises:
   controlling the restoring signal to transit from the zero voltage to a negative voltage;
   controlling the restoring signal to remain the negative voltage for a period of restoring time; and
   controlling the restoring signal to transit from the negative voltage to the zero voltage.

10. The maintenance method of the resistive random access memory as claimed in claim 9, further comprising:
    generating a positive potential during the period of restoring time, wherein the positive potential is adapted to be outputted to the second electrode of the resistive random access memory.

11. The maintenance method of the resistive random access memory as claimed in claim 9, wherein the period of restoring time is larger than 1ns.

12. The maintenance method of the resistive random access memory as claimed in claim 9, wherein the non-zero voltage is a positive voltage.

13. The maintenance method of the resistive random access memory as claimed in claim 9, wherein the non-zero voltage is a negative voltage.

14. The maintenance method of the resistive random access memory as claimed in claim 9, wherein the restoring signal is a square wave.

15. The maintenance method of the resistive random access memory as claimed in claim 9, wherein the restoring signal is a trapezoidal wave.

16. The maintenance method of the resistive random access memory as claimed in claim 9, further comprising:
    calculating a total number of times the operational signal has been outputted; and
    generating the restoring command when the total number of times of the operational signal has reached a predetermined value.

17. A computer program product having a computer program to be loaded in and executed by a computer to execute the maintenance method of the resistive random access memory as claimed in claim 9.

18. A computer readable medium storing a computer program to be loaded in and executed by a computer to execute the maintenance method of the resistive random access memory as claimed in claim 9.

* * * * *